US011545576B2

(12) United States Patent
Yu

(10) Patent No.: US 11,545,576 B2
(45) Date of Patent: Jan. 3, 2023

(54) DISPLAY PANEL AND ELECTRONIC DEVICE

(71) Applicant: TCL CHINA STAR OPTOELECTRONICS TECHNOLOGY CO., LTD., Guangdong (CN)

(72) Inventor: Xiaoping Yu, Guangdong (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/624,212

(22) PCT Filed: Dec. 6, 2019

(86) PCT No.: PCT/CN2019/123476
§ 371 (c)(1),
(2) Date: Sep. 27, 2021

(87) PCT Pub. No.: WO2021/103105
PCT Pub. Date: Jun. 3, 2021

(65) Prior Publication Data
US 2022/0005955 A1    Jan. 6, 2022

(30) Foreign Application Priority Data
Nov. 26, 2019 (CN) .......................... 201911174421.5

(51) Int. Cl.
H01L 29/786 (2006.01)
G02F 1/1335 (2006.01)
G02F 1/1368 (2006.01)
H01L 29/417 (2006.01)
(Continued)

(52) U.S. Cl.
CPC .. H01L 29/78606 (2013.01); H01L 29/41733 (2013.01); H01L 29/42384 (2013.01);
(Continued)

(58) Field of Classification Search
CPC ......... H01L 29/78606; H01L 29/41733; H01L 29/42384; H01L 27/3244; H01L 51/5281; G02F 1/133502; G02F 1/1368
(Continued)

(56) References Cited

U.S. PATENT DOCUMENTS

2009/0267087 A1* 10/2009 Yang ................. G02F 1/136286
438/30
2015/0279917 A1    10/2015 Yang et al.
(Continued)

FOREIGN PATENT DOCUMENTS

| CN | 105510999 A | 4/2015 |
|----|-------------|--------|
| CN | 104952901 A | 9/2015 |

(Continued)

Primary Examiner — Charles S Chang
(74) Attorney, Agent, or Firm — Geoffrey Lottenberg; Berger Singerman LLP

(57) ABSTRACT

The present disclosure provides a display panel and an electronic device. The display panel comprises: a substrate, wherein a metal layer and an anti-reflection film are disposed on the substrate, the anti-reflection film is disposed on a light-emitting side of the metal layer, and the anti-reflection film comprises a protective layer and a darkening layer; wherein the protective layer is disposed between the darkening layer and the metal layer, and a material of the darkening layer comprises at least one of $Mo_aX_bO_c$, $Mo_aX_bN_d$, $Mo_aX_bO_cN_d$, $Mo_aX_bW_c$, $Mo_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium. The display panel and the electronic device of the present disclosure can improve display effect and display quality.

19 Claims, 1 Drawing Sheet

(51) Int. Cl.
*H01L 29/423* (2006.01)
*H01L 27/32* (2006.01)
*H01L 51/52* (2006.01)

(52) U.S. Cl.
CPC ...... *G02F 1/1368* (2013.01); *G02F 1/133502* (2013.01); *H01L 27/3244* (2013.01); *H01L 51/5281* (2013.01)

(58) Field of Classification Search
USPC .............................................. 349/44–46, 139
See application file for complete search history.

(56) References Cited

U.S. PATENT DOCUMENTS

| | | |
|---|---|---|
| 2017/0276968 A1 | 9/2017 | Bai et al. |
| 2018/0067232 A1 | 3/2018 | Tan |
| 2018/0151761 A1 | 5/2018 | Kawata |
| 2020/0019030 A1 | 1/2020 | Cao |
| 2020/0166683 A1 | 5/2020 | Liu et al. |

FOREIGN PATENT DOCUMENTS

| | | | |
|---|---|---|---|
| CN | 105047550 | A | 11/2015 |
| CN | 105204223 | A | 12/2015 |
| CN | 106657830 | A | 10/2016 |
| CN | 107634070 | A | 1/2018 |
| CN | 108287430 | A | 7/2018 |
| CN | 109003943 | A | 12/2018 |
| CN | 109581570 | A | 4/2019 |
| JP | 2000330133 | A | 11/2000 |

\* cited by examiner

DISPLAY PANEL AND ELECTRONIC DEVICE

CROSS-REFERENCE TO RELATED APPLICATIONS

This application is the National phase under 35 U.S.C. § 371 of International Application No. PCT/CN2019/123476, filed Dec. 6, 2019, which claims the benefit of and priority to Chinese Patent Application No. 201911174421.5, filed Nov. 26, 2019. The entire contents of these patent applications are hereby incorporated by reference herein.

FIELD OF INVENTION

The present disclosure relates to the field of display technologies, and more particularly, to a display panel and an electronic device.

BACKGROUND OF INVENTION

With development of display panels, requirements for display panels have become higher, and contrast is one of important indicators to evaluate display quality of display panels.

The contrast relates to brightness of a bright state, brightness of a dark state, and reflectivity. In actual use, due to influence of ambient light, a part of ambient light enters display panels, and is reflected by metal layers in the display panels. However, the metal layers in current display panels have large reflectivity that causes a greater intensity of the reflected light, thereby influencing the contrast of the image and reducing display effect and display quality.

Therefore, it is necessary to provide a display panel and an electronic device to solve the problem in current technology.

Technical problem: the contrast relates to brightness of a bright state, brightness of a dark state, and reflectivity. In actual use, due to influence of ambient light, a part of ambient light enters display panels, and is reflected by metal layers in the display panels. However, the metal layers in current display panels have large reflectivity that causes a greater intensity of the reflected light, thereby influencing the contrast of the image and reducing display effect and display quality.

Therefore, it is necessary to provide a display panel and an electronic device to solve the problem in current technology.

SUMMARY OF INVENTION

An objective of the present disclosure is to provide a display panel and an electronic device to improve display effect and display quality.

To solve the above problem, an embodiment of the present disclosure provides a display panel. The display panel comprises:

a substrate, wherein a metal layer and an anti-reflection film are disposed on the substrate, the anti-reflection film is disposed on a light-emitting side of the metal layer, and the anti-reflection film comprises a protective layer and a darkening layer; wherein the protective layer is disposed between the darkening layer and the metal layer, and a material of the darkening layer comprises at least one of $Mo_aX_bO_c$, $Mo_aX_bN_d$, $Mo_aX_bO_cN_d$, $Mo_aX_bW_c$, $Mo_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium.

An embodiment of the present disclosure further provides an electronic device, which comprises the above display panel.

Beneficial Effect:

The display panel and the electronic device of the present disclosure comprise a substrate, wherein a metal layer and an anti-reflection film are disposed on the substrate. The anti-reflection film is disposed on a light-emitting side of the metal layer, and the anti-reflection film comprises a protective layer and a darkening layer. The protective layer is disposed between the darkening layer and the metal layer, and a material of the darkening layer comprises at least one of $Mo_aX_bO_c$, $Mo_aX_bN_d$, $Mo_aX_bO_cN_d$, $Mo_aX_bW_c$, $Mo_aX_bC_c$, or $Al_aO_bN_c$. Since the anti-reflection film is disposed on the light-emitting side of the metal layer, reflection of ambient light by the metal layer can be effectively reduced, thereby preventing the contrast of the image from being affected, and improving display effect and display quality.

DETAILED DESCRIPTION OF PREFERRED EMBODIMENTS

Figure 1:
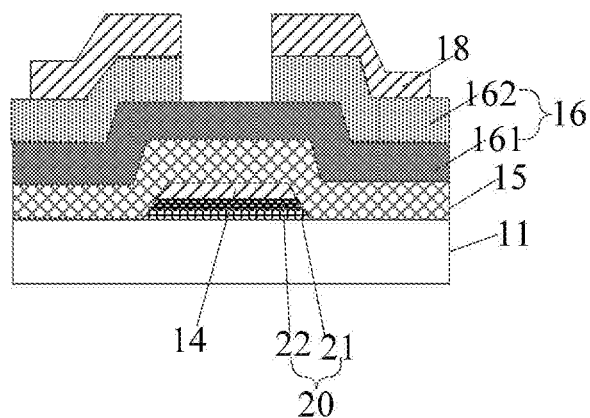
FIG. 1 is a schematic structural diagram of a display panel according to embodiment 1 of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

Referring to FIG. 1, FIG. 1 is a schematic structural diagram of a display panel according to embodiment 1 of the present disclosure.

As shown in FIG. 1, the display panel of the present disclosure comprises a substrate 11, a metal layer and an anti-reflection film 20.

Wherein, the substrate 11 may be a glass substrate.

The metal layer is disposed on the substrate 11 and the metal layer comprises a first sub-metal layer 14 and a second sub-metal layer 18. Wherein, the second sub-metal layer 18 is disposed on the first sub-metal layer 14. Wherein, the first sub-metal layer 14 comprises a gate electrode, and the second sub-metal layer 18 comprises source and drain electrodes. In an embodiment of the present disclosure, in order to further reduce the reflection of ambient light, a thickness of the first sub-metal layer 14 and a thickness of the second sub-metal layer 18 range from 200 nm to 700 nm. Besides, when the thicknesses of the first sub-metal layer and the second sub-metal layer are within this range, adhesion between the metal layer and the darkening layer can be improved. In an embodiment of the present disclosure, in order to improve conductivity of thin film transistors, a material of the metal layer comprises at least one of Cu, Mo, Ti, Al, Ni, Nb, Ta, or Cr. Wherein, materials of the first sub-metal layer 14 and the second sub-metal layer 18 comprise at least one of Cu, Mo, Ti, Al, Ni, Nb, Ta, or Cr.

The anti-reflection film 20 is disposed under the gate electrode 14. That is, the anti-reflection film 20 is disposed on a light-emitting side of the first sub-metal layer 14. Wherein, a light-emitting direction of the display panel in the embodiment follows a first predetermined direction (a top-down direction). Take a liquid crystal display panel for example, an array substrate faces outward at the time, that is, the array substrate is close to an observer. In another embodiment, the anti-reflection film 20 may be disposed under the source and drain electrodes. In other embodiment, the anti-reflection film 20 is disposed under the source and drain electrodes and the gate electrode 14.

The anti-reflection film 20 comprises a darkening layer 21 and a protective layer 22.

A material of the darkening layer 21 comprises at least one of $MO_aX_bO_c$, $MO_aX_bN_d$, $MO_aX_bO_cN_d$, $MO_aX_bW_c$, $MO_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium. Wherein, the darkening layer 21 and the first sub-metal layer 14 have different refractive indices, thereby generating interference with the reflected light. A thickness of the darkening layer 21 may range from 30 nm to 100 nm, and preferably range from 40 to 60 nm. The darkening layer 21 can be directly formed by a deposition method on a selected corresponding substrate, or can be manufactured by infusing oxygen or nitrogen gases in the deposition process when a metal or metal alloy substrate is selected. Wherein, the deposition method may be a physical vapor deposition (PVD).

The protective layer 22 is disposed between the darkening layer 21 and the first sub-metal layer 14. The effect of the protective layer 22 is to improve poor adhesion between the darkening layer 21 and the first sub-metal layer 14, thereby preventing to affect anti-reflective effect. If the darkening layer 21 is in direct contact with the first sub-metal layer 14 (such as Cu which is commonly used in the industry), a problem of poor adhesion will occur, thereby causing a developer to infiltrate the metal layer in subsequent photolithography for patterning which damages the darkening layer, and not achieving the object of reducing reflectivity.

In an embodiment of the present disclosure, in order to improve adhesion between the metal layer and the darkening layer to further reduce reflection of ambient light, a material of the protective layer 22 comprises at least one of Mo, Ti, Si, $SiO_x$, or $SiN_x$. A thickness of the protective layer 22 ranges from 1 nm to 50 nm.

Since the anti-reflection film is disposed under the gate electrode and/or the source and drain electrodes, it can generate interference with the reflected light produced by the first sub-metal layer and/or the second sub-metal layer, which reduces the reflectivity of the first sub-metal layer and/or the second sub-metal layer to ambient light, thereby preventing the contrast from being affected, improving the quality of the display panel, and further improving display effect and display quality.

In an embodiment of the present disclosure, the display panel further comprises a gate insulation layer 15 and an active layer 16. The gate insulation layer 15 is disposed on the gate electrode 14, and the active layer 16 is disposed between the gate electrode and the source and drain electrodes. The active layer 16 may comprise a base 161 and a doped layer 162, the base 161 is made of amorphous silicon materials, the doped layer 162 is made of n-type phosphorus heavily doped silicon materials.

It should be understood that the display panel in the embodiment can be a liquid crystal display panel or an organic light-emitting diode display panel.

Figure 2:
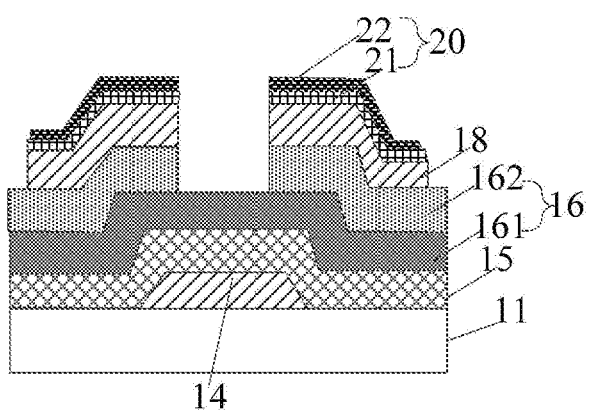
FIG. 2 is a schematic structural diagram of a display panel according to embodiment 2 of the present disclosure.

Referring to FIG. 2, FIG. 2 is a schematic structural diagram of a display panel according to embodiment 2 of the present disclosure.

As shown in FIG. 2, the difference of the display panel in the embodiment from embodiment 1 is that a light-emitting direction of the display panel in the embodiment follows a second predetermined direction. That is, the light-emitting direction of the display panel in the embodiment is bottom-up. The light-emitting direction in the embodiment is opposite to the light-emitting direction in embodiment 1. Take a liquid crystal display panel for example, a color filter substrate faces outward at the time, that is, the color filter substrate is close to an observer.

The anti-reflection film 20 in the embodiment is disposed on the source and drain electrodes. In another embodiment, the anti-reflection film 20 is disposed on the gate electrode 14. In other embodiment, the anti-reflection film 20 is disposed on the gate electrode 14 and the source and drain electrodes.

Wherein, the darkening layer 21 and the second sub-metal layer 18 have different refractive indices, thereby generating interference with the reflected light.

The protective layer 22 is disposed between the darkening layer 21 and the second sub-metal layer 18. The effect of the protective layer 22 is to improve poor adhesion between the darkening layer 21 and the second sub-metal layer 18, thereby preventing to affect anti-reflective effect. If the darkening layer 21 is in direct contact with the second sub-metal layer 18 (such as Cu which is commonly used in the industry), a problem of poor adhesion will occur, thereby causing a developer to infiltrate the metal layer in subsequent photolithography for patterning which damages the darkening layer, and not achieving the object of reducing reflectivity.

Since the anti-reflection film is disposed on the source and drain electrodes and/or the gate electrode, it can generates interference with the reflected light produced by the second sub-metal layer and/or the first sub-metal layer, which reduces the reflectivity of the first sub-metal layer and/or the second sub-metal layer to ambient light, thereby preventing the contrast from being affected, improving the quality of the display panel, and further improving display effect and display quality.

An embodiment of the present disclosure further provides an electronic device, which comprises any one of the above display panels. The electronic device can be electronic products, such as mobile phones and tablets.

The display panel and the electronic device of the present disclosure comprise a substrate, wherein a metal layer and an anti-reflection film are disposed on the substrate. The anti-reflection film is disposed on a light-emitting side of the metal layer, and the anti-reflection film comprises a protective layer and a darkening layer. The protective layer is disposed between the darkening layer and the metal layer, and a material of the darkening layer comprises at least one of $Mo_aX_bO_c$, $Mo_aX_bN_d$, $Mo_aX_bO_cN_d$, $Mo_aX_bW_c$, $Mo_aX_bC_c$, or $Al_aO_bN_c$. Since the anti-reflection film is disposed on the light-emitting side of the metal layer, reflection of ambient light by the metal layer can be effectively reduced, thereby preventing to affect the contrast of the image, and improving display effect and display quality.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
a substrate, wherein a metal layer and an anti-reflection film are disposed on the substrate, the anti-reflection film is disposed on a light-emitting side of the metal layer, and the anti-reflection film comprises a protective layer and a darkening layer;
wherein the protective layer is disposed between the darkening layer and the metal layer, and a material of the darkening layer comprises at least one of $MO_aX_bO_c$, $MO_aX_bN_d$, $MO_aX_bO_cN_d$, $MO_aX_bW_c$, $MO_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium, and a material of the protective layer comprises at least one of Mo, Ti, Si, $SiO_x$, or $SiN_x$,
the metal layer comprises a first sub-metal layer and a second sub-metal layer disposed on the first sub-metal layer, the first sub-metal layer comprises a gate electrode, and the second sub-metal layer comprises source and drain electrodes; and
when a light-emitting direction of the display panel follows a first predetermined direction, the anti-reflection film is disposed under the gate electrode and/or the source and drain electrodes.

2. A display panel, comprising:
a substrate, wherein a metal layer and an anti-reflection film are disposed on the substrate, the anti-reflection film is disposed on a light-emitting side of the metal layer, and the anti-reflection film comprises a protective layer and a darkening layer;
wherein the protective layer is disposed between the darkening layer and the metal layer, and a material of the darkening layer comprises at least one of $MO_aX_bO_c$, $MO_aX_bN_d$, $MO_aX_bO_cN_d$, $MO_aX_bW_c$, $MO_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium.

3. The display panel according to claim 2, wherein a material of the protective layer comprises at least one of Mo, Ti, Si, $SiO_x$, or $SiN_x$.

4. The display panel according to claim 2, wherein the metal layer comprises a first sub-metal layer and a second sub-metal layer disposed on the first sub-metal layer, the first sub-metal layer comprises a gate electrode, and the second sub-metal layer comprises source and drain electrodes; and
when a light-emitting direction of the display panel follows a first predetermined direction, the anti-reflection film is disposed under the gate electrode and/or the source and drain electrodes.

5. The display panel according to claim 4, wherein when a light-emitting direction of the display panel follows a second predetermined direction, the anti-reflection film is disposed on the gate electrode and/or the source and drain electrodes.

6. The display panel according to claim 4, wherein a thickness of the first sub-metal layer and a thickness of the second sub-metal layer range from 200 nm to 700 nm.

7. The display panel according to claim 2, wherein a thickness of the darkening layer ranges from 30 nm to 100 nm.

8. The display panel according to claim 2, wherein a thickness of the protective layer ranges from 1 nm to 50 nm.

9. The display panel according to claim 2, wherein the display panel is a liquid crystal display panel or an organic light-emitting diode display panel.

10. The display panel according to claim 2, wherein a material of the metal layer comprises at least one of Cu, Mo, Ti, Al, Ni, Nb, Ta, or Cr.

11. An electronic device, comprising a display panel;
wherein the display panel comprises a substrate, wherein a metal layer and an anti-reflection film are disposed on the substrate, the anti-reflection film is disposed on a light-emitting side of the metal layer, and the anti-reflection film comprises a protective layer and a darkening layer;
wherein the protective layer is disposed between the darkening layer and the metal layer, and a material of the darkening layer comprises at least one of $MO_aX_bO_c$, $MO_aX_bN_d$, $MO_aX_bO_cN_d$, $MO_aX_bW_c$, $MO_aX_bC_c$, or $Al_aO_bN_c$, wherein a, c, and d are rational numbers greater than 0, b is a rational number greater than or equal to 0, and X is at least one of tantalum, vanadium, nickel, niobium, zirconium, tungsten, titanium, rhenium, or hafnium.

12. The electronic device according to claim 11, wherein a material of the protective layer comprises at least one of Mo, Ti, Si, $SiO_x$, or $SiN_x$.

13. The electronic device according to claim 11, wherein the metal layer comprises a first sub-metal layer and a second sub-metal layer disposed on the first sub-metal layer, the first sub-metal layer comprises a gate electrode, and the second sub-metal layer comprises source and drain electrodes; and
when a light-emitting direction of the display panel follows a first predetermined direction, the anti-reflection film is disposed under the gate electrode and/or the source and drain electrodes.

14. The electronic device according to claim 13, wherein when a light-emitting direction of the display panel follows a second predetermined direction, the anti-reflection film is disposed on the gate electrode and/or the source and drain electrodes.

15. The electronic device according to claim 13, wherein a thickness of the first sub-metal layer and a thickness of the second sub-metal layer range from 200 nm to 700 nm.

16. The electronic device according to claim 11, wherein a thickness of the darkening layer ranges from 30 nm to 100 nm.

17. The electronic device according to claim 11, wherein a thickness of the protective layer ranges from 1 nm to 50 nm.

18. The electronic device according to claim 11, wherein the display panel is a liquid crystal display panel or an organic light-emitting diode display panel.

19. The electronic device according to claim 11, wherein a material of the metal layer comprises at least one of Cu, Mo, Ti, Al, Ni, Nb, Ta, or Cr.

* * * * *